(12) United States Patent
Vilem et al.

(10) Patent No.: US 11,879,635 B2
(45) Date of Patent: Jan. 23, 2024

(54) SPECTRAL ADJUSTMENT OF AN LED ARRAY

(71) Applicant: Robe Lighting s.r.o., Roznov pod Radhostem (CZ)

(72) Inventors: Jan Vilem, Vsetin (CZ); Tomas David, Podoli (CZ); Josef Valchar, Prostredni Becva (CZ)

(73) Assignee: ROBE lighting s.r.o., Roznov pod Radhostem (CZ)

( * ) Notice: Subject to any disclaimer, the term of this patent is extended or adjusted under 35 U.S.C. 154(b) by 0 days.

(21) Appl. No.: 17/986,256

(22) Filed: Nov. 14, 2022

(65) Prior Publication Data

US 2023/0071012 A1 Mar. 9, 2023

Related U.S. Application Data

(60) Provisional application No. 63/279,506, filed on Nov. 15, 2021.

(51) Int. Cl.
*F21V 9/30* (2018.01)
*F21V 9/08* (2018.01)
(Continued)

(52) U.S. Cl.
CPC .............. *F21V 9/30* (2018.02); *F21V 5/007* (2013.01); *F21V 5/048* (2013.01); *F21V 9/08* (2013.01);
(Continued)

(58) Field of Classification Search
CPC ..... F21V 9/08; F21V 9/20; F21V 9/30; F21V 5/007; F21V 5/048; F21V 13/02; F21Y 2105/18; F21Y 2115/10
See application file for complete search history.

(56) References Cited

U.S. PATENT DOCUMENTS 10,244,687 B1   4/2019  Vardi
2002/0079506 A1* 6/2002  Komoto ............... H01L 33/508
                                              257/99
(Continued)

FOREIGN PATENT DOCUMENTS

CN      209245987 U    8/2019
JP      2018029025 A   2/2018
WO      2020203053 A1  10/2020

OTHER PUBLICATIONS

Extended European Search Report; Application No. 22207359.5; dated Apr. 14, 2023; 8 pages.

*Primary Examiner* — Joseph L Williams
(74) *Attorney, Agent, or Firm* — Conley Rose, P.C.; Brooks W Taylor

(57) ABSTRACT

A luminaire is provided that includes an LED light engine emitting a light engine light beam and one or more optical devices configured to receive the light engine light beam and form a luminaire light beam emitted by the luminaire. The LED light engine includes an array of LED emitters mounted on a substrate, an array of lenses optically coupled to the array of LED emitters, and a plurality of filter regions. The filter regions of the plurality of filter regions are optically coupled to and fixedly mounted relative to the array of LED emitters. Each filter region of the plurality of filter regions is aligned with an associated LED of the array of LED emitters and is configured to filter substantially only light emitted by the associated LED.

21 Claims, 8 Drawing Sheets

(51) Int. Cl.
  *F21V 9/20* (2018.01)
  *F21V 5/00* (2018.01)
  *F21V 13/02* (2006.01)
  *F21V 5/04* (2006.01)
  *F21Y 115/10* (2016.01)
  *F21Y 105/18* (2016.01)

(52) U.S. Cl.
  CPC ............... *F21V 9/20* (2018.02); *F21V 13/02* (2013.01); *F21Y 2105/18* (2016.08); *F21Y 2115/10* (2016.08)

(56) References Cited

U.S. PATENT DOCUMENTS

| | | | |
|---|---|---|---|
| 2004/0116033 A1* | 6/2004 | Ouderkirk | H01L 33/505 257/E33.072 |
| 2016/0061390 A1 | 3/2016 | Osten et al. | |
| 2019/0219249 A1* | 7/2019 | David | H05B 45/20 |

* cited by examiner

SPECTRAL ADJUSTMENT OF AN LED ARRAY

CROSS-REFERENCE TO RELATED APPLICATIONS

This application claims priority to U.S. Provisional Application No. 63/279,506 filed Nov. 15, 2021 by Jan Vilém, et al. entitled, "Spectral Adjustment of an LED Array", which is incorporated by reference herein as if reproduced in its entirety.

TECHNICAL FIELD OF THE DISCLOSURE

The disclosure generally relates to light-emitting diode (LED) luminaires, and more specifically to a method for adjusting the spectral output of a luminaire using a multi-emitter LED array.

BACKGROUND

Luminaires with automated and remotely controllable functionality (referred to as automated luminaires) are well known in the entertainment and architectural lighting markets. Such products are commonly used in theatres, television studios, concerts, theme parks, night clubs, and other venues. A typical automated luminaire provides control from a remote location of the output intensity, color and other functions of the luminaire allowing an operator to control such functions for many luminaires simultaneously. Many automated luminaires additionally or alternatively provide control from the remote location of other parameters such as position, focus, zoom, beam size, beam shape, and/or beam pattern of light beam(s) emitted from the luminaire.

SUMMARY

In a first embodiment, a light engine includes an array of LED emitters and a plurality of filter regions. The filter regions of the plurality of filter regions are optically coupled to and fixedly mounted relative to the array of LED emitters. Each filter region of the plurality of filter regions is aligned with an associated LED of the array of LED emitters and is configured to filter substantially only light emitted by the associated LED.

In a second embodiment, a light engine includes an array of LED emitters mounted on a substrate, an array of lenses optically coupled to the array of LED emitters, and a plurality of filter regions. The filter regions of the plurality of filter regions are optically coupled to and fixedly mounted relative to the array of LED emitters. Each filter region of the plurality of filter regions is aligned with an associated LED of the array of LED emitters and is configured to filter substantially only light emitted by the associated LED.

In a third embodiment, a luminaire includes an LED light engine emitting a light engine light beam and one or more optical devices configured to receive the light engine light beam and form a luminaire light beam emitted by the luminaire. The LED light engine includes an array of LED emitters mounted on a substrate, an array of lenses optically coupled to the array of LED emitters, and a plurality of filter regions. The filter regions of the plurality of filter regions are optically coupled to and fixedly mounted relative to the array of LED emitters. Each filter region of the plurality of filter regions is aligned with an associated LED of the array of LED emitters and is configured to filter substantially only light emitted by the associated LED.

BRIEF DESCRIPTION OF THE DRAWINGS

For a more complete understanding of this disclosure, reference is now made to the following brief description, taken in conjunction with the accompanying drawings in which like reference numerals indicate like features.

DETAILED DESCRIPTION

Preferred embodiments are illustrated in the figures, like numerals being used to refer to like and corresponding parts of the various drawings.

Figure 1:
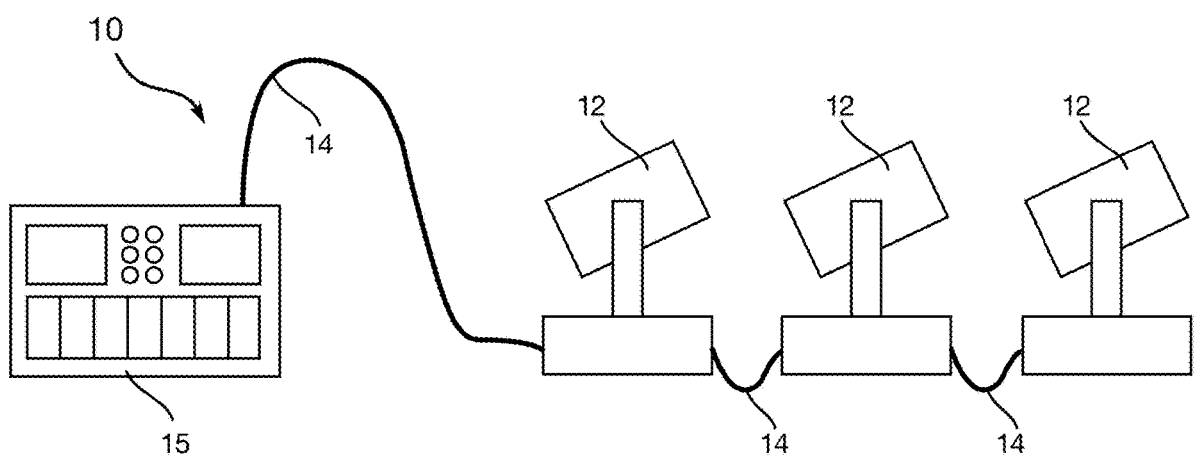
FIG. 1 presents a schematic view of a luminaire system according to the disclosure.

FIG. 1 presents a schematic view of a luminaire system 10 according to the disclosure. The luminaire system 10 includes a plurality of luminaires 12 according to the disclosure. The luminaires 12 each includes on-board a multi-emitter LED light source, light modulation devices, and may optionally include pan and/or tilt systems to control an orientation of a head of the luminaire 12.

In addition to being connected to mains power either directly or through a power distribution system, the control system of each luminaire 12 is connected in series or in parallel by a data link 14 to one or more control desks 15. Upon actuation by an operator, the control desk 15 sends control signals via the data link 14, where the control signals are received by the control system of one or more of the luminaires 12. The control systems of the one or more of the luminaires 12 that receive the control signals may respond by changing one or more of the parameters of the receiving luminaires 12. The control signals are sent by the control desk 15 to the luminaires 12 using DMX-512, Art-Net, ACN (Architecture for Control Networks), Streaming ACN, or other suitable communication protocol.

The luminaires 12 include a light source comprising a multi-emitter LED light source, sometimes referred to as a light engine. The multi-emitter LED light source may include multiple sets of LED emitters (or LEDs) where each set of LEDS emits light of a different color. In some embodiments, the colors used for the LED sets may be red, green, blue, amber, and lime. In operation the operator through the control system may control the relative intensities of the sets of LEDs so as to additively combine the outputs and adjust the color of the emitted beam. For example, illuminating just the red and green LEDs will produce a yellow beam, blue and green will produce a cyan beam, and so on. By judicious control of the intensities of the sets of LEDs the operator can produce a wide range of colors including deep saturated colors, pastels, and a wide range of whites of varying color temperatures.

However, LEDs are available in a limited number of colors. Some colors are not available with present technology, while others may be available in a lower saturation than can effectively mix with deeply saturated output colors. Additionally, some LEDs (referred to as phosphor converted LEDs) produce a long wavelength color by illuminating an internal phosphor layer with, e.g., a blue or violet light from a pump LED. That is, the phosphor converted LED emits light of a desired first color by illuminating the phosphor layer with light of a second color from the pump LED. In some phosphor converted LEDs, there can be leakage of light from the pump LED through the phosphor layer, which can result in the LED emitting an undesired combined color. The phosphor converted LED emitting the color referred to as 'lime' is an example of this.

As used herein, the term 'LED' refers to any of semiconductor LEDs; organic LEDs (OLEDs); laser pumped emitters; laser pumped, phosphor converted emitters; and other suitable solid state light emitters.

Figure 2:
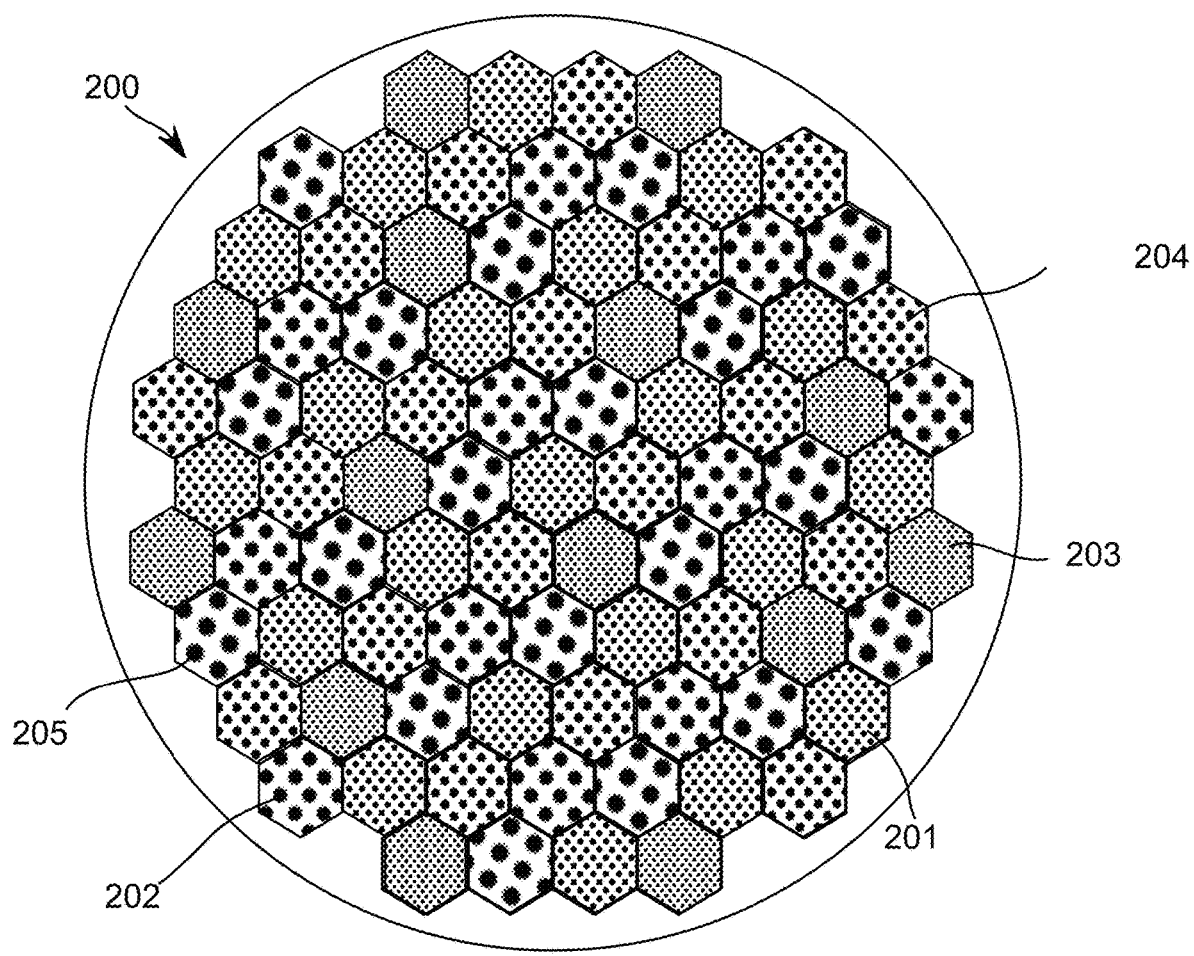
FIG. 2 presents an example of an LED array of a luminaire according to the disclosure.

FIG. 2 presents an example of an LED array 200 of a luminaire according to the disclosure (for example, the luminaire 12 of FIG. 1 or a luminaire 700, described below with reference to FIG. 7). Multi-emitter LED array 200 comprises 5 sets of LEDs in red 201, green 202, blue 203, amber 204, and lime 205. The sets of LEDs may be distributed throughout the array so as to assist with homogenizing all the LEDs and colors into a single output beam in later stages of an optical system of the luminaire. The approximately octagonal array 200 shown is purely exemplary. Arrays anticipated by this disclosure include arrays of any shape or size with any number of sets of LEDs each including any number of LEDs.

Figure 3:
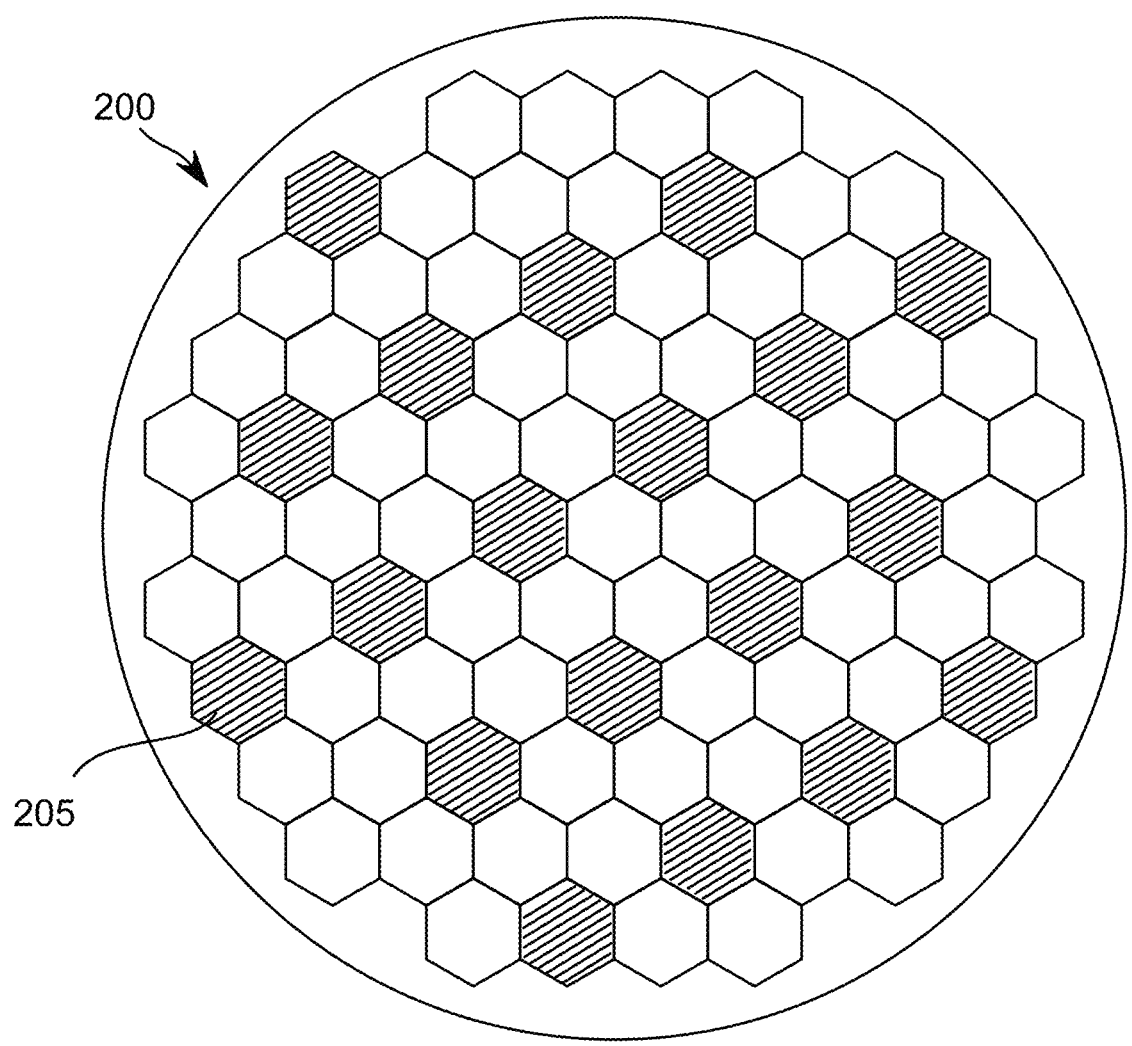
FIG. 3 identifies LED emitters of a single color within an LED array of a luminaire according to the disclosure.
Figure 8:
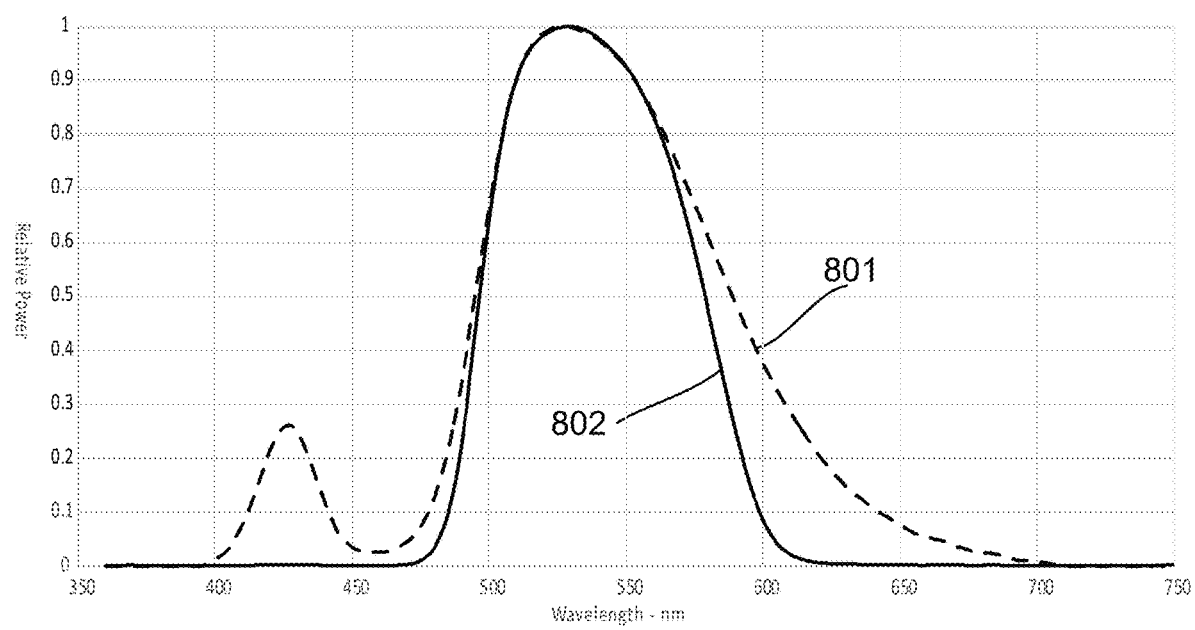
FIG. 8 presents an example of the spectral change applied to a lime LED emitter by a filter.

FIG. 3 identifies LED emitters of a single color within an LED array 200 of a luminaire according to the disclosure. In this example, each of the lime LED 205 is identified within the array. The lime LED, as shown in spectral power distribution (SPD) curve 801 of FIG. 8, has an emission spectrum with two peaks. The peak at approximately 425 nm (425 nanometers) is the underlying pump LED while the broad peak centered around approximately 530 nm is the output from the phosphor within the LED that down converts the blue light from the blue LED pump into a broad green output.

In one embodiment of the disclosure, it is desired to suppress the blue pump output from the lime LEDs 205 with minimal effect on the output from any of the other sets and colors of LEDs in array 200. In another embodiment of the disclosure, the amber LEDs 204 may be phosphor converted LEDs and filters according to the disclosure may be used to suppress a blue pump light output from the amber LEDs 204.

Figure 4:
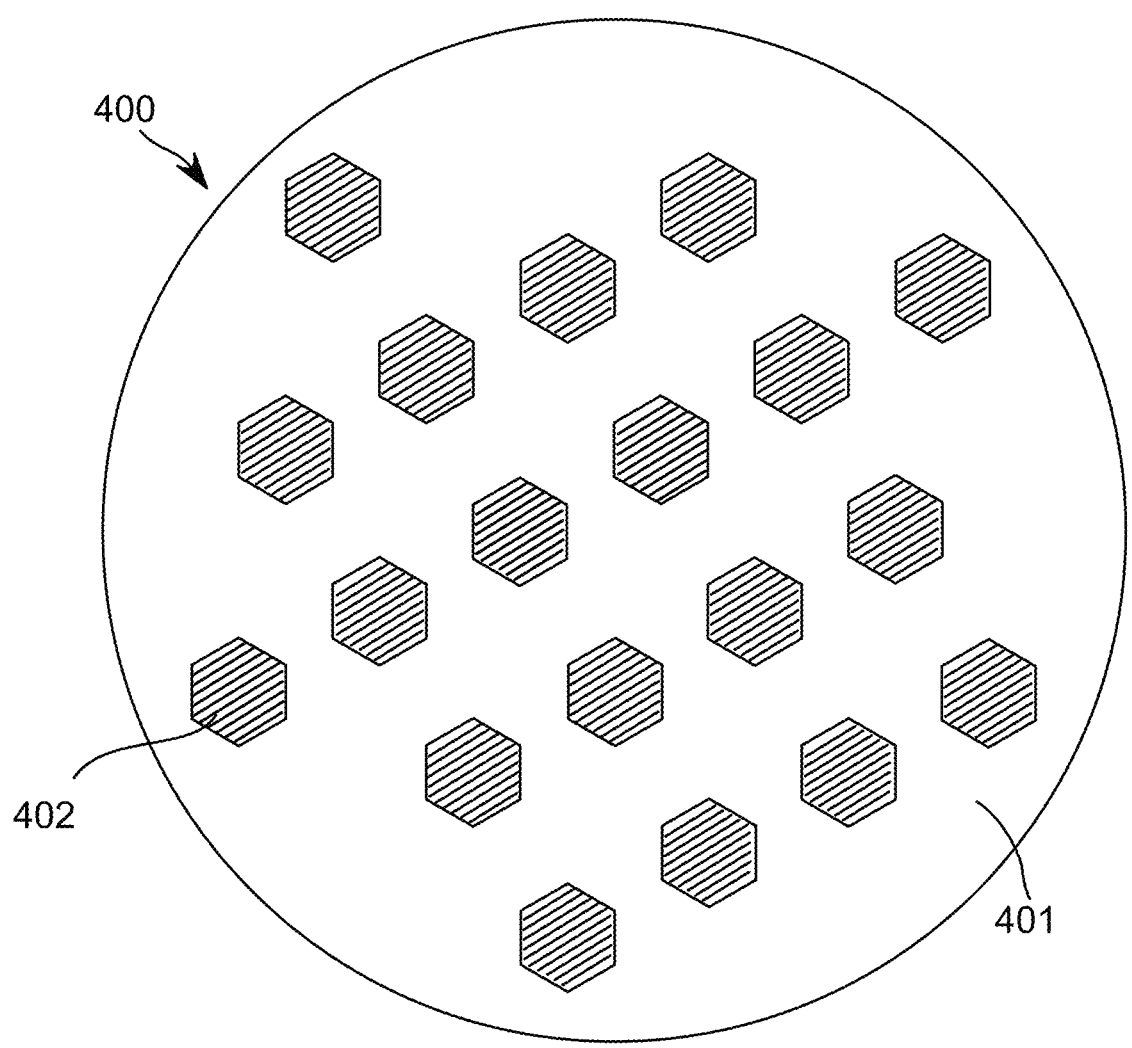
FIG. 4 presents an optical filter according to the disclosure.

FIG. 4 presents an optical filter 400 according to the disclosure. The optical filter 400 comprises filter regions 402. In this example, the filter regions 402 align with the lime LEDs 205 shown in FIG. 3, where the filter regions 402 minimally overlap or color light from LEDs adjacent to the lime LEDs. As such, the filter regions 402 filter substantially only light from the associated lime LEDs 205. Filtering substantially only the light from an associated LED is defined herein as less than twenty percent (20%) of the light passing through the filter being emitted by LEDs other than the associated LED. A light beam emitted from the optical filter 400 comprises filtered and unfiltered light passing through respectively the filter regions 402 and the remainder of the optical filter 400.

In some embodiments, the filter regions 402 comprise a thin film dichroic coating that is applied either to the lime LEDs 205, to a surface of one or more lenses in the optical system, or to a transparent filter material inserted in the optical path. In some embodiments, the optical filter 400 may be manufactured by coating an entire surface 401 and then selectively removing areas via laser ablation or chemical etching to form the filter regions 402. In other embodiments, the optical filter 400 may be manufactured by selectively coating the surface 401 through a mask to form the filter regions 402. Still other embodiments may utilize filter materials other than dichroic coatings such as dyed or colored absorptive filter material.

The color of filter regions 402 is chosen so as to provide the desired color filtering and spectral modification to the selected LED. In the example shown here, the filter of the filter regions 402 is a broad green filter with a transmission curve that allows the green peak of the lime LED to pass while blocking the blue peak from the LED pump (as shown in the resulting SPD curve 802 of FIG. 8). Although filter regions 402 of only a single color are shown, the disclosure is not so limited and one or more filters of one or more other colors may be utilized in front of other sets of associated LEDs within the multi-emitter LED array.

In other embodiments, one or more filters may be chosen to tune the spectrum of the light from an LED to match (or emulate) the output of a similar, but not identical, LED from another manufacturing batch or from another manufacturer. For example, an amber LED from manufacturer A may differ in spectral emission (or SPD) from an amber LED from manufacturer B. A suitable filter in front of the amber LEDs from manufacturer A may be used to emulate the unfiltered spectra of the LEDs from manufacturer B. The unfiltered spectrum of the LED to be emulated may be referred to as a desired or specified SPD curve. In such embodiments, a transmission curve of the filter regions 402 is configured to cause filtered SPD curves of the filters' associated LEDs to more closely match the desired SPD curve.

Such a filter may be configured to match the center wavelength, the half power bandwidth, the color point, or some other suitable color-related characteristic to emulate the spectra of the LEDs from manufacturer B. In some such embodiments, photometric parameters including but not limited to, center wavelength, half power bandwidth, or color point could be adjusted to improve the match between two groups of LEDs.

In a yet further embodiment, a filter region according to the disclosure may be configured to narrow the SPD curve of an associated LED so as to increase the saturation of light from the filtered LED. In some examples, the SPD curve is narrowed by reducing the half power bandwidth of the light from the filtered LED. Narrowing the SPD curve enables the mixing of more saturated colors when the filtered LED is used in conjunction with other LEDs. For example, a narrow red filter in front of red LEDs will produce a more saturated red output which, in turn, allows higher saturation yellows and magentas to be produced when the filtered red LEDs are combined with green and blue LEDs, respectively.

In other embodiments, a filter region according to the disclosure may be configured to flatten the SPD curve of an associated LED so as to produce a spectrum that better matches that of a black body radiator and thus improve the color rendering. In still other embodiments, a filter region according to the disclosure may be configured to reduce a central portion of the SPD curve of an associated LED so as to reduce any objectionable green shift in the light.

Figure 5:
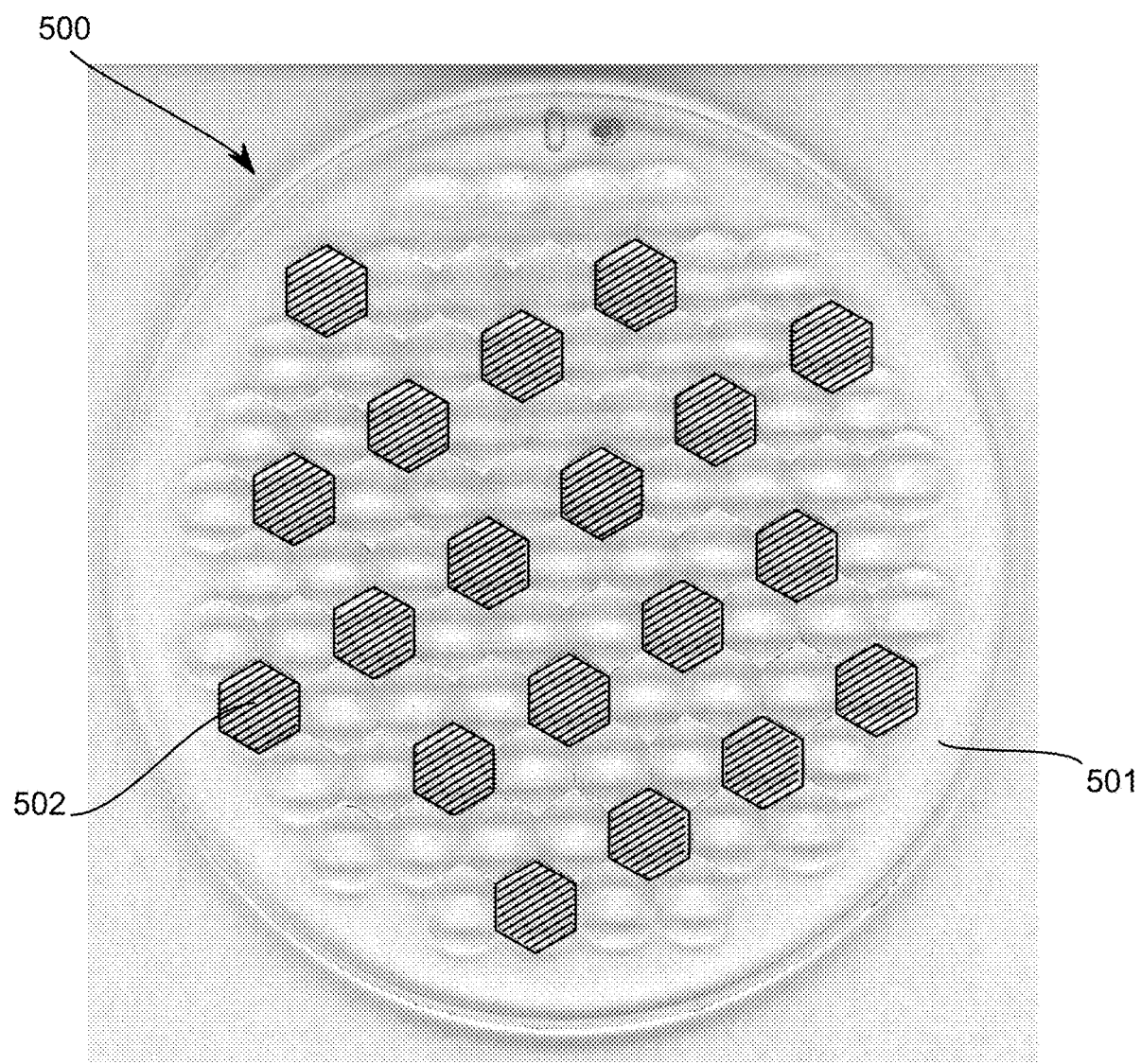
FIG. 5 presents another embodiment of an optical filter according to the disclosure.

FIG. 5 presents another embodiment of an optical filter according to the disclosure. The optical filter of FIG. 5 comprises individual filter regions 502 covering discrete surfaces 501 of a lens array 500. While the filter regions 502 are separate from each other, in other embodiments filter regions according to the disclosure may be adjacent to each other, for example, where two lime LEDs 205 are located adjacent to each other in the LED array 200, or where a lime LED 205 is located adjacent to a red LED 201 whose SPD curve is narrowed (as described above) by a filter region according to the disclosure.

Figure 6:
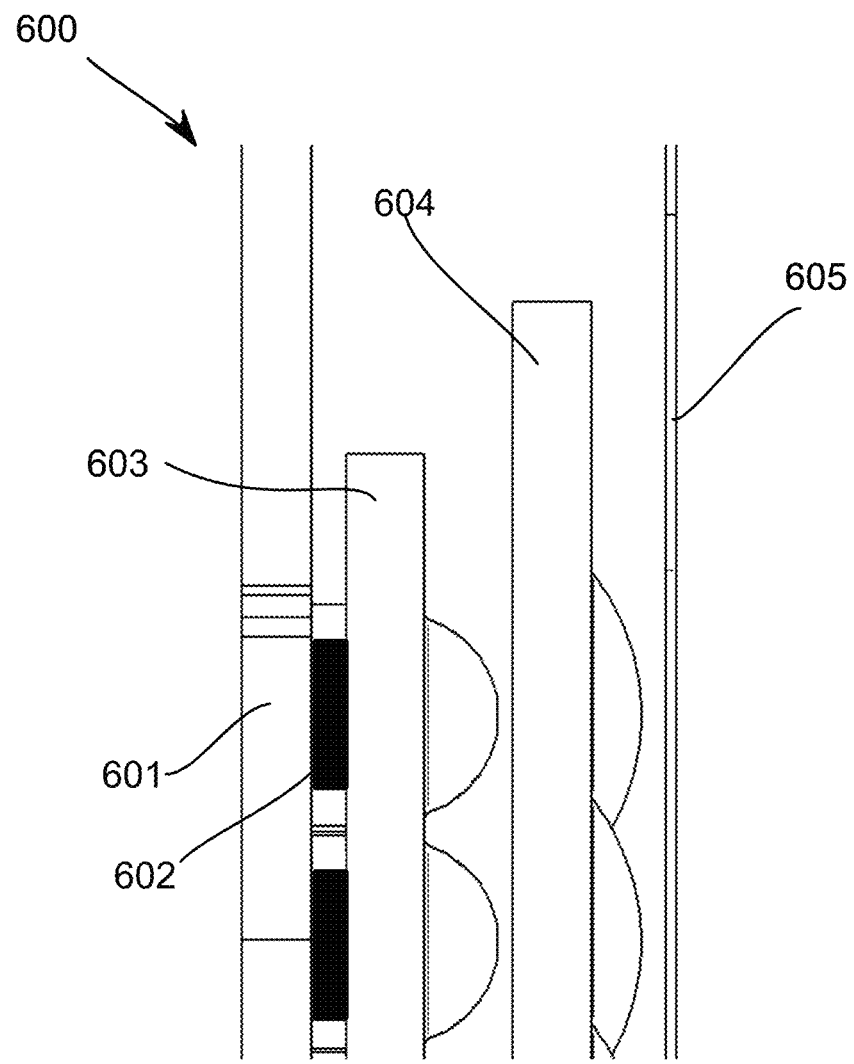
FIG. 6 presents an elevation of an LED light engine, comprising an array of LED emitters and associated light engine optics according to the disclosure.

FIG. 6 presents an elevation of an LED light engine 600, comprising an array of LED emitters (or LEDs) 602 and associated light engine optics according to the disclosure. The LEDs 602 are mounted to substrate 601. Light from the LEDs 602 passes through first lens array 603, second lens array 604 and optional homogenizer 605 before emitting as a light engine light beam from the LED light engine 600. Filter regions according to the disclosure may be applied as a coating to any surface through which emitted light of the packages of the LEDs 602 passes—e.g., the surface of the LED die, a phosphor substrate of the LED, a surface of a primary optic of the LED package that receives light from the LED, or a surface of the primary optic from which light is emitted toward the first lens array 603. In other embodiments, the filter regions according to the disclosure may be applied to one or more surfaces of the associated light engine optics, including, but not limited to, front and/or rear surfaces of the first lens array 603, front and/or rear surfaces of the second lens array 604, and/or front and/or rear surfaces of the homogenizer 605, where the rear surface of the light engine optic is defined as located closer to the LEDs 602 and the front surface is defined as located farther from the LEDs 602. In some embodiments, various ones of the filter regions according to the disclosure may be applied to various different ones of the surfaces of the LEDs 602 and the surfaces of the associated light engine optics or to a transparent filter material mounted in the optical path of the LED light engine 600. In all embodiments of the LED light engine 600 (as described with reference to optical filter 400 of FIG. 4), the filter regions according to the disclosure are configured to filter substantially only light emitted by individual associated LEDs of the LEDs 602. The light engine light beam comprises light emitted by the array of LED emitters 602 and passing through one or both of the first and second lens arrays 603 and 604 and the filter regions according to the disclosure.

One advantage of placing the filter regions according to the disclosure close to the LEDs 602 is that, if a dichroic filter is used, the blue light reflected back from the filter may illuminate the phosphor in the LED a second time and be converted by the phosphor to the desired color. This recycling of the unwanted light increases the efficiency of the system. In embodiments where a dichroic filter is used, it is advantageous to position the filter at a position in the optical path where the light rays are as near to parallel to each other for a flat filter or as near as normal to a surface of a curved filter as possible. Dichroic filters are angle dependent and such an orientation of the light rays relative to the filter will minimize color shifts across the filter caused by the angle of the light rays passing through the filter. For example, a filter on the surface of LED 602 will be receiving light rays emitted by the LED 602 that are close to normal to the surface of the LED 602. Similarly, a flat filter positioned between the first lens array 603 and the homogenizer 605 will receive light rays that are close to parallel to each other. Additionally, a position may be chosen for the filter regions according to the disclosure where substantially only light from a single LED passes through each of the filters, so as to minimize the filters' effect on light from adjacent LEDs.

Figure 7:
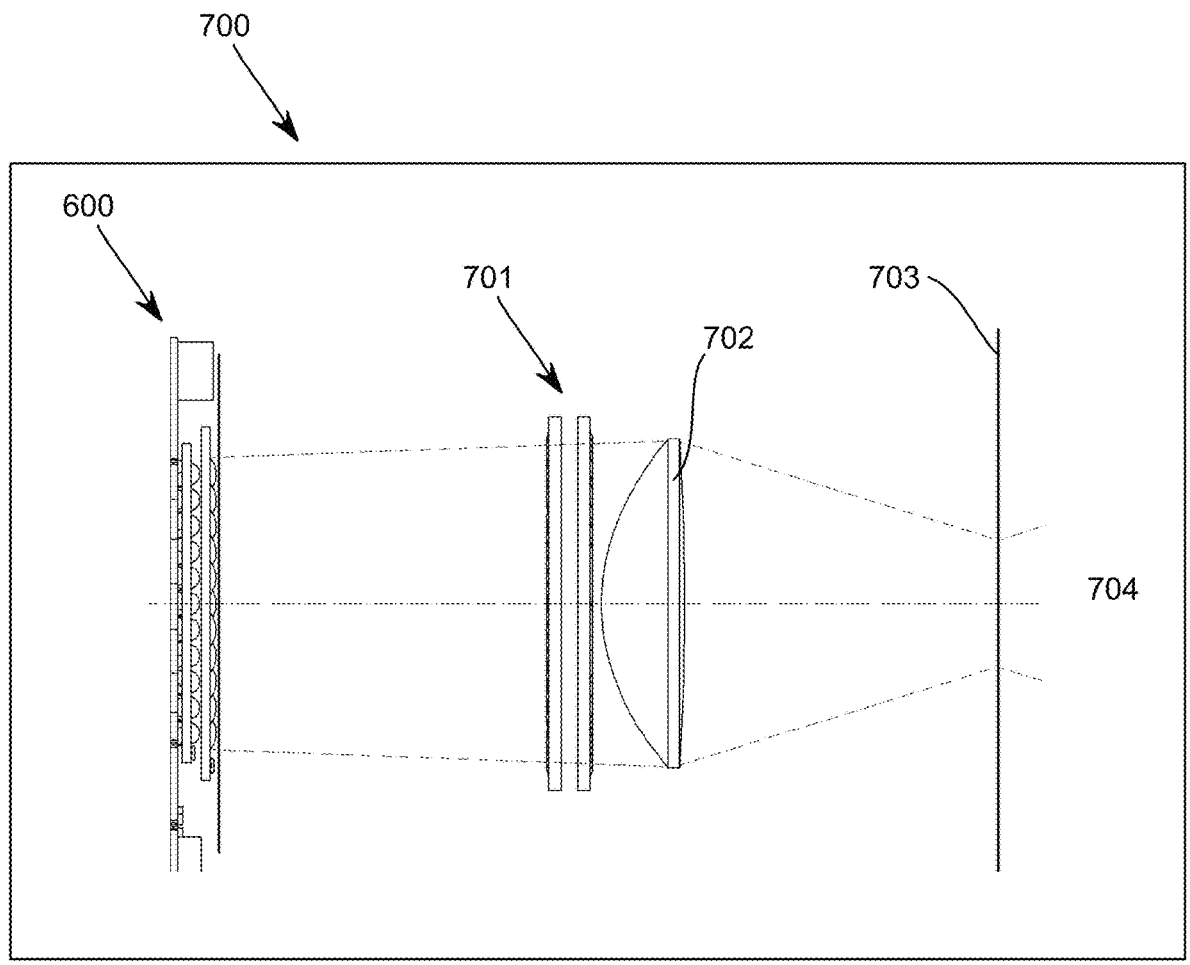
FIG. 7 presents a schematic of a portion of an optical system of a luminaire according to the disclosure.

FIG. 7 presents a schematic of a portion of an optical system of a luminaire 700 according to the disclosure. The luminaire 700 may comprise a fixedly mounted fixture, the panning/tilting head of the luminaire 12 described with reference to FIG. 1, or the light engine of a moving mirror fixture. A light engine light beam as emitted by the LED light engine 600 (as described and shown in FIG. 6) passes through optical devices such as beam homogenizing optics 701, condenser lens 702, and imaging plane 703, before exiting the imaging plane 703 as light beam 704 and passing through projection optics and/or optical devices such as gobos, irises, or prisms (not shown in FIG. 7) to emit from the luminaire 700 as a luminaire light beam. In other embodiments, the light engine light beam emitted by the LED light engine 600 may pass through more, fewer, or different optical devices before emitting from a luminaire according to the disclosure as a luminaire light beam.

While only some embodiments of the disclosure have been described herein, those skilled in the art, having benefit of this disclosure, will appreciate that other embodiments may be devised which do not depart from the scope of the disclosure herein. While the disclosure has been described in detail, it should be understood that various changes, substitutions, and alterations can be made hereto without departing from the spirit and scope of the disclosure.

What is claimed is:

1. A light engine comprising:
   an array of LED emitters, comprising phosphor converted LEDs; and
   a plurality of filter regions optically coupled to and fixedly mounted relative to the array of LED emitters, each filter region of the plurality of filter regions aligned with an associated LED of the array of LED emitters and configured to filter substantially only light emitted by the associated LED, wherein a transmission curve of the filter regions is configured to pass light of a first color having a desired spectral power distribution (SPD) curve different than an SPD curve of the first color emitted by a phosphor layer of the phosphor converted LEDs, and reflect light of a second color emitted by a pump LED of the phosphor converted LEDs.

2. The light engine of claim 1, wherein the transmission curve of the filter regions is configured to narrow the SPD curves of the associated LEDs.

3. The light engine of claim 1, wherein the filter regions comprise dichroic filters.

4. The light engine of claim 3, wherein the dichroic filters comprise a coating on a surface of a package of each of the associated LEDs.

5. The light engine of claim 1, wherein the LED emitters comprise one or more of organic LEDs and laser pumped emitters.

6. The light engine of claim 1, wherein the transmission curve of the filter regions is configured to flatten the SPD curves of the associated LEDs.

7. The light engine of claim 1, wherein the transmission curve of the filter regions is configured to reduce a central portion of the SPD curves of the associated LEDs.

8. A light engine comprising:
   an array of LED emitters mounted on a substrate, comprising phosphor converted LEDs;
   an array of lenses optically coupled to the array of LED emitters; and a plurality of filter regions optically coupled to and fixedly mounted relative to the array of LED emitters, each filter region of the plurality of filter regions aligned with an associated LED of the array of LED emitters and configured to filter substantially only light emitted by the associated LED wherein a transmission curve of the filter regions is configured to pass light of a first color having a desired spectral power distribution (SPD) curve different than an SPD curve of the first color emitted by a phosphor layer of the phosphor converted LEDs, and reflect light of a second color emitted by a pump LED of the phosphor converted LEDs.

9. The light engine of claim 8, wherein the filter regions comprise dichroic filters.

10. The light engine of claim 8, wherein each filter region comprises a coating, the coating located on a surface of a package of the associated LED, a rear surface of a lens of the array of lenses, or on a front surface of the lens of the array of lenses.

11. The light engine of claim 8, wherein the transmission curve of the filter regions is configured to narrow of the SPD curves of the associated LEDs.

12. The light engine of claim 8, wherein the LED emitters comprise one or more of organic LEDs and laser pumped emitters.

13. The light engine of claim 8, wherein the transmission curve of the filter regions is configured to flatten the SPD curves of the associated LEDs.

14. The light engine of claim 8, wherein the transmission curve of the filter regions is configured to reduce a central portion of the SPD curves of the associated LEDs.

15. A luminaire comprising:
an LED light engine emitting a light engine light beam, the LED light engine comprising:
an array of LED emitters mounted on a substrate, comprising phosphor converted LEDs;
an array of lenses optically coupled to the array of LED emitters; and
a plurality of filter regions optically coupled to and fixedly mounted relative to the array of LED emitters, each filter region of the plurality of filter regions aligned with an associated LED of the array of LED emitters and configured to filter substantially only light emitted by the associated LED, wherein a transmission curve of the filter regions is configured to pass light of a first color having a desired spectral power distribution (SPD) curve different than an SPD curve of the first color emitted by a phosphor layer of the phosphor converted LEDs, and reflect light of a second color emitted by a pump LED of the phosphor converted LEDs, the light engine light beam comprising light emitted by the array of LED emitters and passing through one or both of the array of lenses and the plurality of filter regions; and
one or more optical devices configured to receive the light engine light beam and form a luminaire light beam emitted by the luminaire.

16. The luminaire of claim 15, wherein the filter regions comprise dichroic filters.

17. The luminaire of claim 15, wherein each filter region comprises a coating, the coating located on a surface of a package of the associated LED, a rear surface of a lens of the array of lenses, or on a front surface of the lens of the array of lenses.

18. The luminaire of claim 15, wherein the transmission curve of the fitter regions is configured to narrow the SPD curves of the associated LEDs.

19. The luminaire of claim 15, wherein the LED emitters comprise one or more of organic LEDs and laser pumped emitters.

20. The luminaire of claim 15, wherein the transmission curve of the filter regions is configured to flatten the SPD curves of the associated LEDs.

21. The luminaire of claim 15, wherein the transmission curve of the filter regions is configured to reduce a central portion of the SPD curves of the associated LEDs.

\* \* \* \* \*